(12) United States Patent
Martinez et al.

(10) Patent No.: US 9,867,285 B2
(45) Date of Patent: Jan. 9, 2018

(54) PRINTED CIRCUIT BOARD COMPONENTS

(71) Applicant: Apple Inc., Cupertino, CA (US)

(72) Inventors: Paul A. Martinez, Morgan Hill, CA (US); Tyler S. Bushnell, Mountain View, CA (US); Jason C. Sauers, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 217 days.

(21) Appl. No.: 14/843,000

(22) Filed: Sep. 2, 2015

(65) Prior Publication Data

US 2016/0366765 A1 Dec. 15, 2016

Related U.S. Application Data

(60) Provisional application No. 62/173,186, filed on Jun. 9, 2015.

(51) Int. Cl.
| | |
|---|---|
| *H05K 7/10* | (2006.01) |
| *H05K 7/12* | (2006.01) |
| *H05K 1/02* | (2006.01) |
| *H05K 3/30* | (2006.01) |
| *H05K 3/34* | (2006.01) |

(52) U.S. Cl.
CPC ........... *H05K 1/0295* (2013.01); *H05K 3/301* (2013.01); *H05K 3/3436* (2013.01); *H05K 3/3442* (2013.01); *H05K 2201/094* (2013.01); *H05K 2201/09954* (2013.01); *H05K 2201/1031* (2013.01); *H05K 2201/10515* (2013.01); *H05K 2201/10636* (2013.01); *H05K 2201/10962* (2013.01); *H05K 2201/2036* (2013.01)

(58) Field of Classification Search
CPC .................................. H05K 1/14; H05K 1/181
See application file for complete search history.

(56) References Cited

U.S. PATENT DOCUMENTS

| | | | |
|---|---|---|---|
| 6,356,448 B1 | 3/2002 | DiBene, II et al. | |
| 6,717,500 B2 | 4/2004 | Girbachi et al. | |
| 2008/0218988 A1* | 9/2008 | Burns | H05K 1/023 361/811 |
| 2010/0224401 A1* | 9/2010 | Lin | H05K 1/0218 174/377 |

(Continued)

*Primary Examiner* — Yuriy Semenenko
(74) *Attorney, Agent, or Firm* — Treyz Law Group, P.C.; Joseph F. Guihan; David K. Cole

(57) ABSTRACT

An electronic device may include surface mount technology components mounted to a printed circuit board. The surface mount technology components may include electrical components such as resistors, inductors, and capacitors. In order to reduce the size of the electronic device, surface mount technology components may be stacked. A surface mount technology component may be mounted to metal members that electrically connect the surface mount technology component to contact pads on a printed circuit board. A surface mount technology component may be provided with integral standoff portions, and a second surface mount technology component may be mounted to the integral standoff portions. A single surface mount technology component may be used to implement different circuits depending on which face of the surface mount technology component is mounted to the printed circuit board.

22 Claims, 13 Drawing Sheets

(56) References Cited

U.S. PATENT DOCUMENTS

| | | | | |
|---|---|---|---|---|
| 2013/0201616 A1* | 8/2013 | Arnold | ............... | G06F 1/183 |
| | | | | 361/679.02 |
| 2013/0203274 A1* | 8/2013 | Kraft | ............... | H01R 12/52 |
| | | | | 439/74 |
| 2013/0329388 A1* | 12/2013 | Dogauchi | ............ | H05K 1/0216 |
| | | | | 361/767 |
| 2013/0335931 A1 | 12/2013 | Snider et al. | | |
| 2014/0085850 A1* | 3/2014 | Li | ............... | H05K 1/0231 |
| | | | | 361/773 |
| 2015/0243937 A1 | 8/2015 | Dinh et al. | | |

* cited by examiner

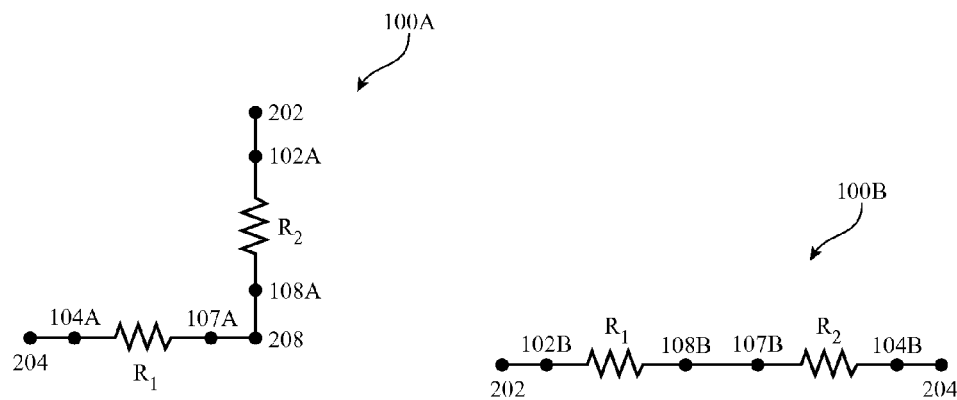
FIG. 11A
FIG. 11B
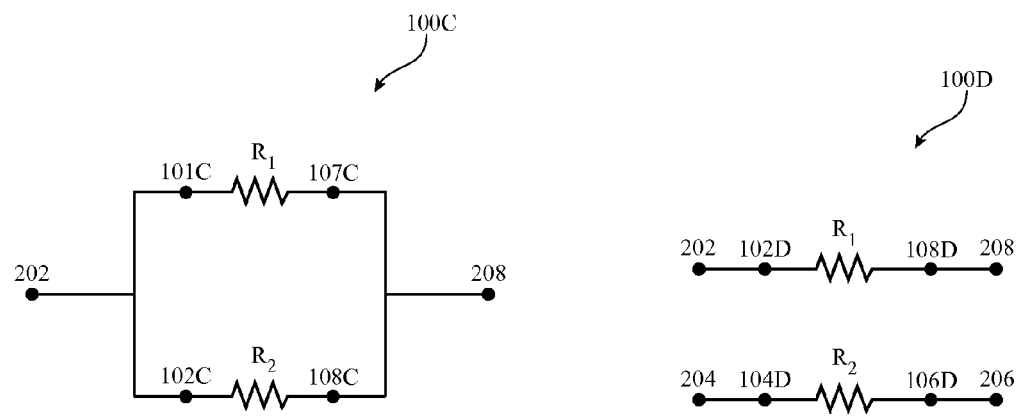
FIG. 11C
FIG. 11D

PRINTED CIRCUIT BOARD COMPONENTS

This application claims the benefit of provisional patent application No. 62/173,186 filed on Jun. 9, 2015, which is hereby incorporated by reference herein in its entirety.

BACKGROUND

This relates generally to electronic components, and more particularly, to mounting electronic components on substrates.

Electronic equipment such as computers, portable devices, and other electronic devices often include electrical components. Electrical components may be mounted to substrates such as printed circuit boards. Surface mount technology (SMT) is often used. For example, printed circuit boards may be provided with surface mount technology components such as capacitors, resistors, and inductors.

It is often desirable to minimize the size of electronic equipment. This can be challenging, particularly when a printed circuit contains numerous components. In certain scenarios, components of different heights may be mounted to a printed circuit. This may leave unused space above the shorter components.

Standard electrical components may have one configuration that forms a given circuit. This lack of versatility may be overly limiting in certain scenarios.

It would therefore be desirable to offer improved printed circuit board components.

SUMMARY

Electronic devices may contain electrical systems based on integrated circuits and other circuitry. The integrated circuits and other circuitry may be mounted on a printed circuit board or other substrate.

Contacts in the printed circuit board may be coupled to interconnect traces within the board. Integrated circuits and other electrical components may be mounted to the printed circuit board contacts.

The electrical components on the printed circuit board may include surface mount technology components. Multiple surface mount technology components may be stacked on top of each other to minimize the amount of area that is consumed on the printed circuit board. Standoffs made partially or entirely of conductive material may be used to electrically connect surface mount technology components to the printed circuit board contacts. A surface mount technology component may include integral standoff portions that electrically connect another surface mount technology component to the printed circuit board. The integral standoff portions may be made partially or entirely of conductive material.

Component placement tools may be used to place individual surface mount technology components on the printed circuit board. The surface mount technology components may be encapsulated with injection molded material to form packed component groups on the printed circuit board.

A surface mount technology component may be provided that contains at least one electrical component in a dielectric body. The surface mount technology component may have multiple faces with metal contacts. The circuit implemented using the surface mount technology component may depend on which face is electrically connected to the printed circuit.

Further features of the invention, its nature and various advantages will be more apparent from the accompanying drawings and the following detailed description of the preferred embodiments.

BRIEF DESCRIPTION OF THE DRAWINGS

FIGS. 11A-11D are circuit diagrams of illustrative circuits of the type that may be implemented using the faces shown in FIGS. 9A-9D in accordance with an embodiment.

DETAILED DESCRIPTION

Electronic devices such as cellular telephones, tablet computers, laptop computers, desktop computers, computers integrated into computer monitors, televisions, media players, portable devices, and other electronic equipment may include integrated circuits and other electronic components.

The electronic components may be mounted on a substrate such as a printed circuit or other dielectric substrate. A printed circuit substrate may be formed from a rigid printed circuit board such as a fiberglass-filled epoxy board or may be formed from a flexible printed circuit structure ("flex circuit") formed from a flexible sheet of polymer such as polyimide. Other substrates may be formed from glass, ceramic, plastic, or other dielectrics. The electronic components that are mounted on a substrate may include discrete components such as capacitors, resistors, and inductors and may include integrated circuits such as microprocessors, system-on-chip integrated circuits, memory chips, audio and video circuits, communications chips, application-specific integrated circuits, and other devices.

Figure 1:
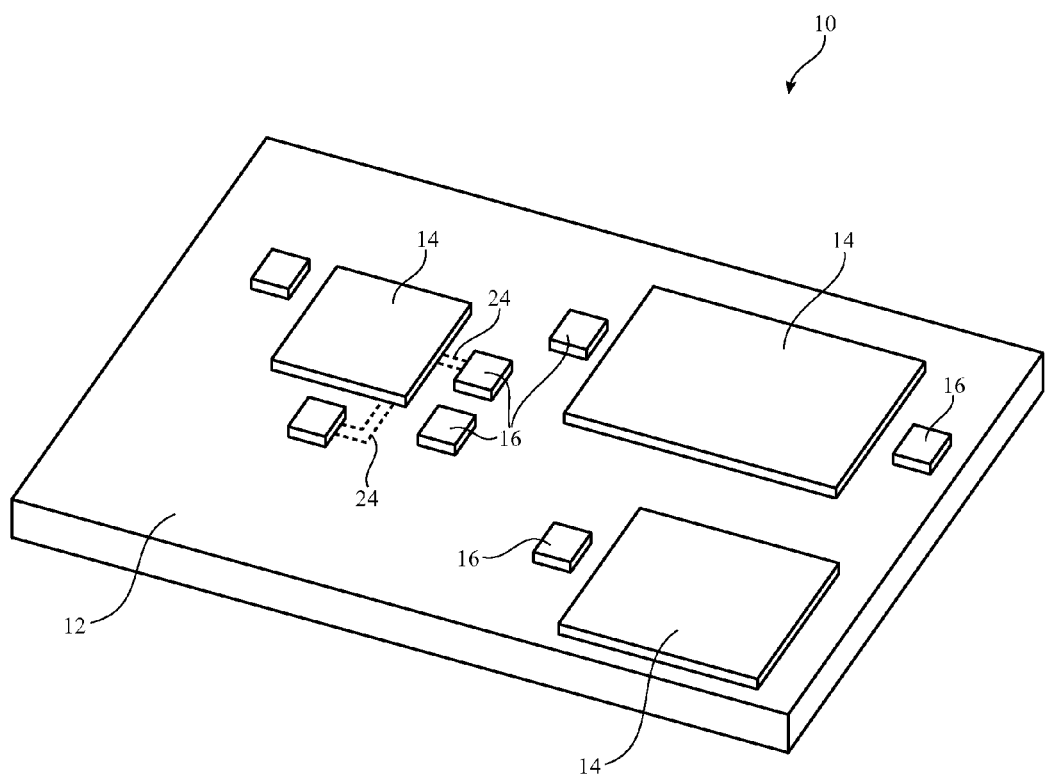
FIG. 1 is a perspective view of a printed circuit board populated with surface mount technology components and integrated circuits in accordance with an embodiment.

FIG. 1 is a perspective view of an illustrative electrical system formed from circuitry mounted on a substrate. Circuitry 10 of FIG. 1 may be used in a cellular telephone, computer, television, media player, or other electronic equipment. Circuitry 10 may include components such as integrated circuits 14 mounted on substrate 12. Substrate 12 may be formed from a dielectric structure such as a plastic structure, ceramic structure, glass structure, or other structure. If desired, substrate 12 may be formed from a printed circuit structure. As an example, substrate 12 may be a rigid printed circuit board or a flexible printed circuit.

Components such as electronic components 16 may also be mounted on substrate 12. Electronic components 16 may include discrete components such as resistors, capacitors, and inductors (as an example). If desired, components 16 may be mounted adjacent to integrated circuits 14. Conductive interconnects such as traces 24 of FIG. 1 may be used to interconnect the circuits formed form components 16 with circuits 14.

Components 16 may be formed using surface mount technology (SMT) parts. For example, surface mount devices (SMDs) such as SMT capacitors, SMT inductors, and SMT resistors may be used in forming components 16. To conserve space on substrate 12, multiple individual SMT components may be used in forming each component 16. For example, multiple SMT capacitors, SMT resistors, and/or SMT inductors may be vertically stacked and/or horizontally stacked to form a component such as component 16.

Figure 2:
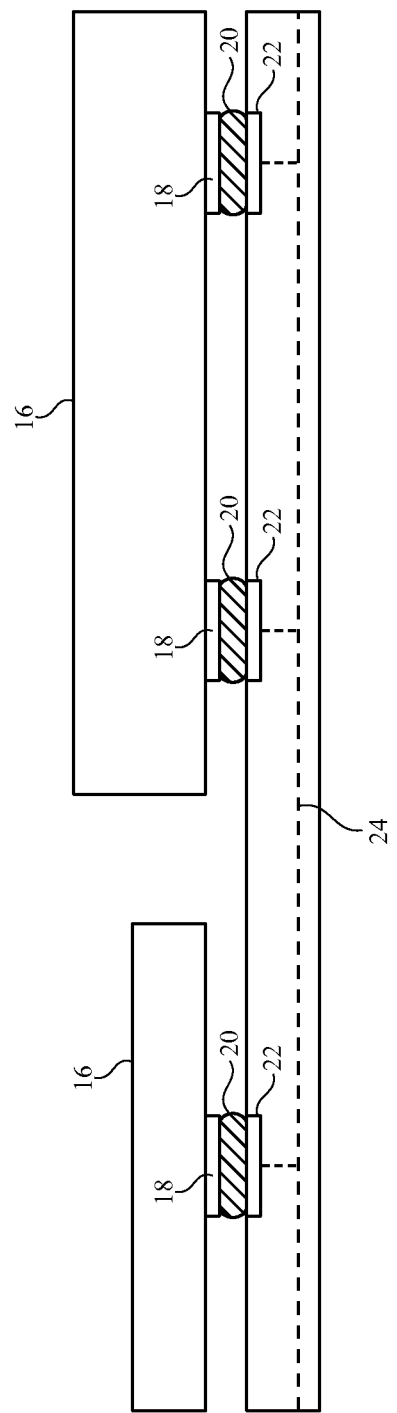
FIG. 2 is a cross-sectional side view of an illustrative printed circuit board with surface mount technology components in accordance with an embodiment.

Illustrative SMT components are shown in FIG. 2. Each SMT component 16 may have contacts 18. Contacts 18, which may sometimes be referred to as terminals or contact pads, may be formed from metal such as gold plated copper (as an example). Conductive material 20 may be used in attaching contacts 18 on one component to contacts such as pads 22 on substrate 12. Contacts on substrate 12 such as contact pads 22 (e.g., printed circuit board contacts) may be formed from portions of patterned metal traces 24. Traces 24 may form signal interconnect lines on substrate 12. One or more layers of interconnects in substrate 12 may be used in routing signals between components 16 and integrated circuits 14 (FIG. 1).

Conductive material 20 may be formed from solder, conductive adhesive, or other conductive substances. For example, conductive material 20 may include conductive adhesive such as an anisotropic conductive film, conductive epoxy, etc., or a conductive connection formed from thermosonic bonding. If desired, contacts 18 may be coupled to each other using welds, using shared conductive structures that form multiple contacts 18 (e.g., a metal member that is common to multiple contacts 18), or other electrically conductive structures. The use of solder to connect contacts 18 and contact pads 22 is sometimes described herein as an example.

Solder connections such as connections 20 of FIG. 2 may be formed from solder paste. Solder paste may be deposited on contacts 22 by screen printing, painting, ink-jet printing, or other suitable techniques. To form solder connections such as solder connections 20 of FIG. 2, the solder paste may be heated. Heat may be applied to the solder paste in a reflow oven or using a heated element (as examples).

Figure 3:
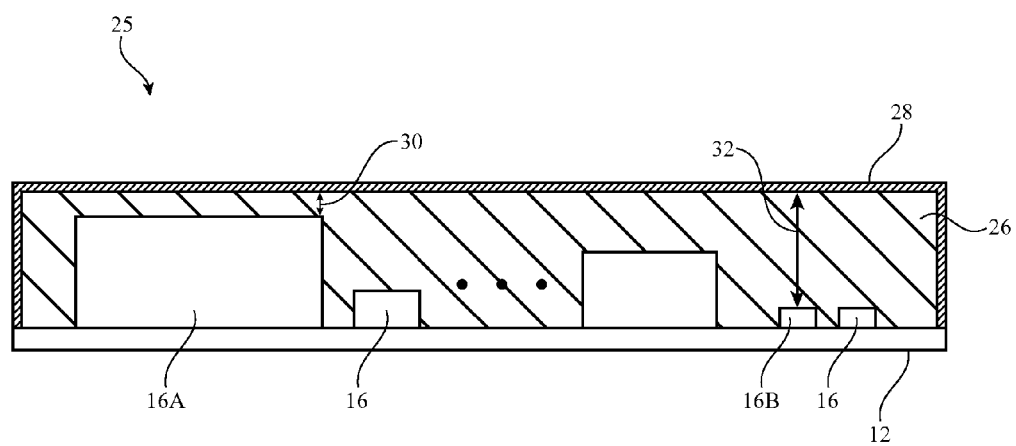
FIG. 3 is a cross-sectional side view of an illustrative package with surface mount technology components in accordance with an embodiment.

In certain embodiments, substrate 12 and its accompanying components 16 may be encapsulated by an encapsulant to form package 25. FIG. 3 is a cross-sectional side view of an illustrative package with surface mount technology components mounted on a substrate. As shown, a number of electronic components 16 may be mounted on substrate 12. These components may be covered by a conformal encapsulant. The encapsulant may be formed from an insulating material. Insulating material 26 may include thermoset and thermoplastic materials such as plastics or other polymers. A conductive layer such as conductive layer 28 may be formed on the exterior of encapsulant 26. The conductive layer may provide electromagnetic shielding to the components in package. Package 25 may be situated in an electronic device with a number of components that generate electromagnetic signals. The shielding layer 28 will prevent any electromagnetic signals from reaching the surface mount technology components 16 and affecting the performance in the surface mount technology components. Shielding layer 28 may be formed from any desired material. For example, shielding layer 28 may be formed from aluminum or nickel.

In FIG. 3, the shielding layer is illustrated as surrounding the package on three sides (e.g., the top surface and the side surfaces). However, the shielding layer may completely encapsulate the package such that the entire package is surrounded by conductive material 28.

Insulating material 26 may be formed over components 16 with molding tools. The molding tools may include injection molding tools, insert molding tools, matrix molding tools, compression molding tools, transfer molding tools, and other tools suitable for molding insulating materials 26 into a desired configuration. Insulating materials 26 may cover components 16 and may help protect components 16. Insulating materials 26 may provide structural support and help to maintain the positioning of components 16 (e.g., to maintain connections between contacts 18 and corresponding substrate contact pads 22). Insulating materials 26 may fill the space in between the components to help electrically isolate some of components 16.

The metal layer that is used in forming shield 28 may be deposited using physical vapor deposition (e.g., evaporation or sputtering), may be formed using electrochemical deposition (e.g., using electroplating or electroless deposition techniques), and/or by otherwise applying a conductive material to upper surface of insulating material 26.

Package 25 may be formed with a planar top surface. Enough encapsulant 26 may be used to completely cover all of the components mounted on substrate 12. However, the components on substrate 12 may have non-uniform heights. FIG. 3 shows a first electronic component 16A that has a greater height than a second electronic component 16B. Electronic component 16A may be the tallest electronic component mounted on substrate 12. To ensure adequate structural and electrical shielding of component 16A, encapsulant 26 may cover component 16A. Component 16A may be separated from the top surface of the encapsulant by a distance 30. Distance 30 may be greater than 1 millimeter, less than 1 millimeter, or less than 0.1 millimeter. In one illustrative example, distance 30 may be about 0.1 millimeters. Meanwhile, package 25 may include an electronic component 16B with a height much less than that of electronic component 16A. Electronic component 16B may be separated from the top surface of encapsulant 26 by distance 32. Distance 32 may be greater than 1 millimeter, less than 1 millimeter, or less than 0.1 millimeter. In one illustrative example, distance 32 may be about 0.6 millimeters. To minimize the size of package 25 (and the electronic device in which package 25 is implemented), it may be desirable to reduce the distance 32 between electronic components 16 and the top surface of encapsulant 26. A large separation between a component 16 and the top of encapsulant 26 represents space that may be better used to hold additional electronic components. By stacking shorter components in areas where excess height does not increase the overall volume of the package, the footprint and volume of the package may be reduced.

Figure 4:
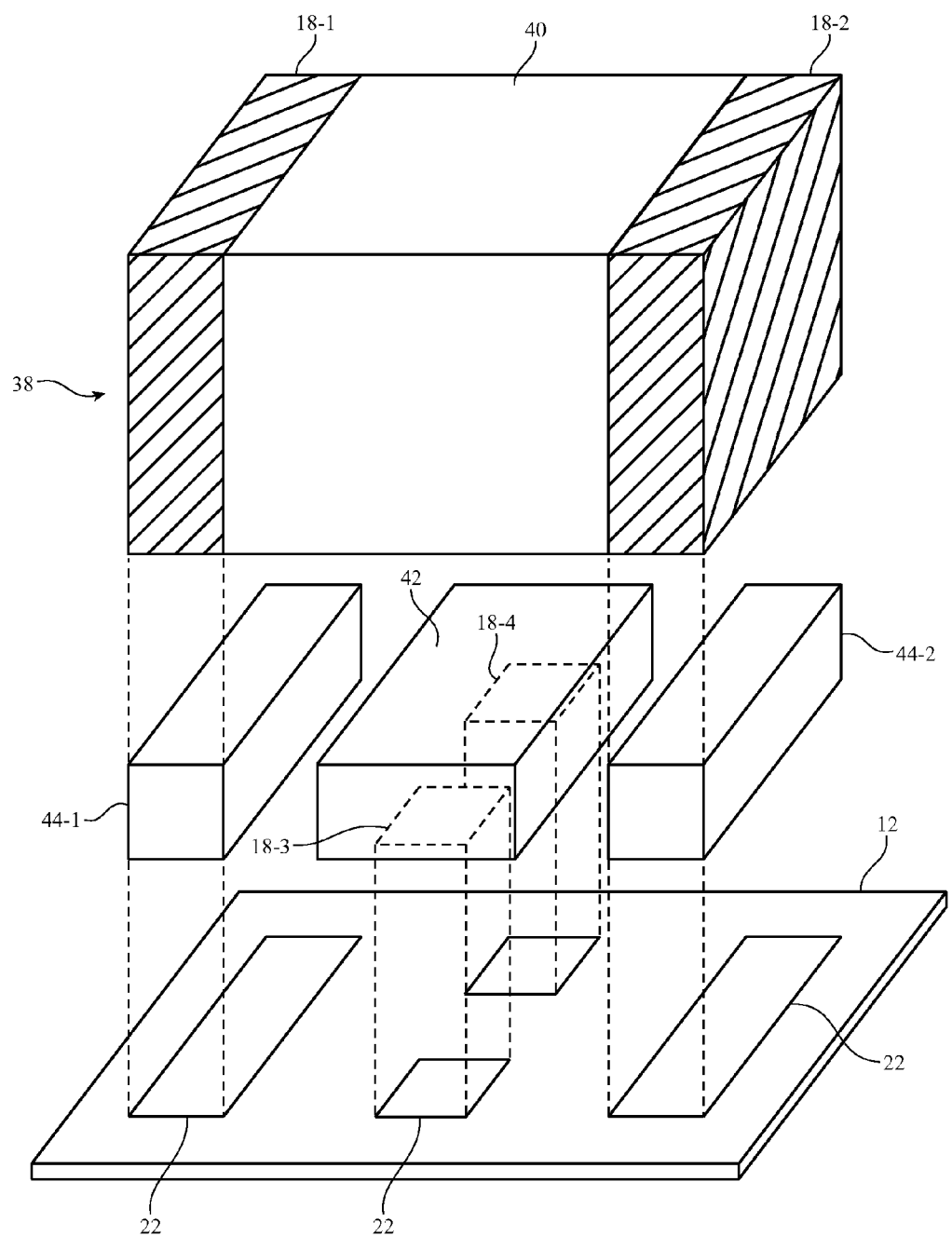
FIG. 4 is an exploded perspective view of illustrative stacked surface mount technology components that may be implemented using a conductive standoff in accordance with an embodiment.

One illustrative way to stack components is shown in the exploded perspective view of FIG. 4. As shown in FIG. 4, a SMT component 38 may have a dielectric body 40, sometimes referred to as a housing. A portion of housing 40 such as the center of housing 40 may be free of conductive contact material. Terminals may be formed from contacts 18-1 and 18-2 on housing 40. Contacts 18-1 and 18-2 may be formed from metal or other conductive material. In the example of FIG. 4, contacts 18-1 and 18-2 have been formed on opposing ends of dielectric body 40. Other configurations for the contacts in SMT device 38 may be used if desired.

An electrical component such as a resistor, capacitor, or inductor (or a circuit formed from multiple circuit components) may be housed within housing 40. In certain embodiments, SMT component 38 may be a "0201" SMT component. In these embodiments, SMT component 38 may have a length of 0.6 mm and a width of 0.3 mm. In other embodiments, SMT component 38 may be a "1005" SMT component. In these embodiments, SMT component 38 may have a length of 0.4 mm and a width of 0.2 mm. Other types of packages may be used if desired. The use of 0201 and 1005 packages is merely illustrative.

A second SMT component 42 may also be mounted to substrate 12. SMT component 42 may have terminals formed from contacts 18-3 and 18-4 on a bottom surface of the component. Contacts 18-3 and 18-4 may be formed from metal or other conductive material. In the example of FIG. 4, terminals 18-3 and 18-4 are formed opposing ends of the bottom surface of SMT component 42. This example is purely illustrative, and other configurations for contacts in SMT device 42 may be used if desired. SMT component 42 may be a resistor, capacitor, or inductor (or a circuit formed from multiple circuit components). SMT component 38 may be a 0201 or 1005 SMT component. Contacts 18-3 and 18-4 of SMT component 42 may be mounted to contact pads 22 on substrate 12.

Instead of being mounted directly to printed contact pads 22 on substrate 12, SMT component 38 may be mounted to an intervening conductive standoff 44, sometimes referred to as a conductive structure or metal member. Conductive standoff 44 may be formed from metal or another conductive material. SMT component 38 may be electrically connected to contact pads 22 on substrate 12 via standoff 44 (e.g., contact 18-1 is connected to a contact pad via metal member 44-1 and contact 18-2 is connected to a contact pad via metal member 44-2). Conductive standoff 44 may be entirely conductive or only partially conductive. For example, in one embodiment conductive standoff 44 may be formed from blocks of metal. In another embodiment, conductive standoff 44 may be formed from a dielectric material with a conductive via that extends from the bottom to the top of the standoff. In general, any configuration of standoff 44 that electrically connects contacts 18-1 and 18-2 to contact pads 22 may be used.

Standoff 44 may have a height that is greater than or equal to the height of SMT component 42. By at least matching the height of SMT component 42, standoff 44 may be used to mount SMT component 38 above SMT component 42. SMT component 38 may entirely overlap SMT component 42 (e.g., no portion of the footprint of SMT component 42 extends past the footprint of SMT component 38). Alternatively, SMT component 38 may only partially overlap SMT component 42 (e.g., a portion of the footprint of SMT component 42 extends past the footprint of SMT component 38).

Figure 5:
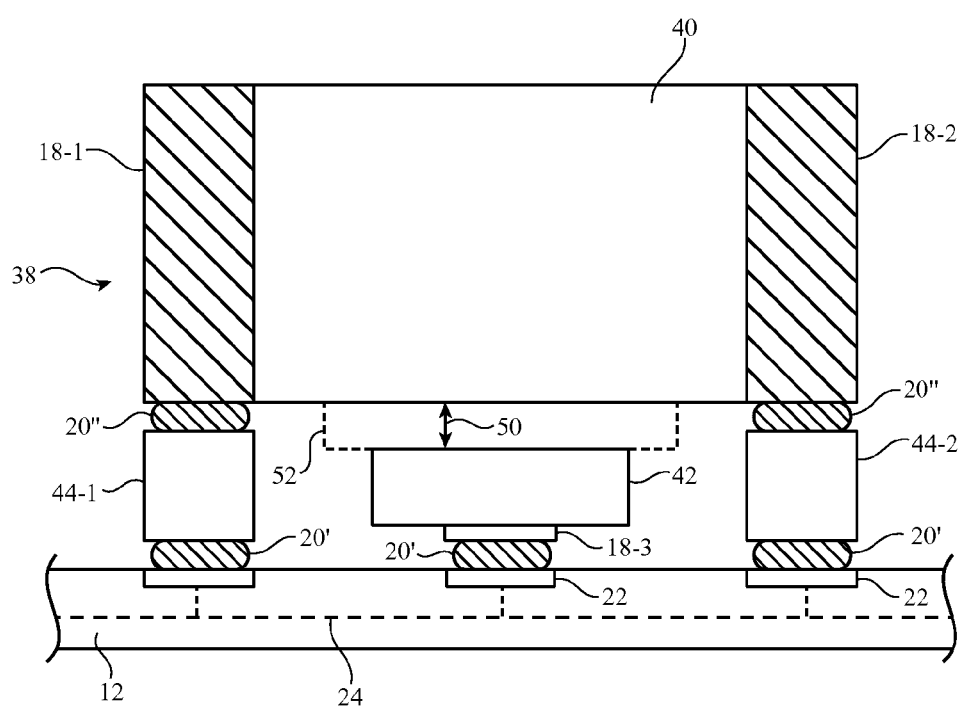
FIG. 5 is a cross-sectional side view of the illustrative stacked surface mount technology components and accompanying conductive standoff shown in FIG. 4 in accordance with an embodiment.

FIG. 5 is a cross-sectional side view of the illustrative surface mount technology components and accompanying conductive standoff shown in FIG. 4. As shown, both the conductive standoff 44 and SMT component 42 may be mounted to contact pads 22 with conductive material 20'. Conductive material 20" may also be disposed on the top of standoffs 44. SMT component 38 may be mounted to standoffs 44 via conductive material 20".

FIG. 5 depicts conductive material 20' and 20" as being disposed on and in direct contact with standoffs 44. This example is purely illustrative. In alternate embodiments, standoffs 44 may be provided with any number of contacts 18 to electrically connect standoff 44 to conductive material 20' and 20".

Standoff 44 may have a height such that SMT component 38 is positioned above SMT component 42. In certain embodiments, a bottom surface of SMT component 38 may be in direct contact with a top surface of SMT component 42. In other embodiments, the bottom surface of SMT component 38 and the top surface of SMT component 42 may be separated by gap 50 (less than 1 mm, less than 0.1 mm, less than 0.01 mm, etc.). SMT components 38 and 42 may be separated by an air gap without any intervening materials. In other embodiments, an optional insulator 52 may be included in the gap between SMT components 38 and 42. Insulator 52 may ensure that the top surface of SMT component 42 is electrically isolated from the bottom surface of SMT component 38. Insulator 52 may be formed from polyimide, ceramic, glass, or another dielectric material.

Certain embodiments where conductive materials 20' and 20" are solder are described herein. Solder connections may be formed by reflowing solder paste structures in a reflow oven, by heating solder paste or solder balls using a localized heat source such as a hot bar or heat gun, or using other suitable solder reflow techniques. As the solder paste is heated and reflows, solder joints may be formed to electrically and mechanically couple components together. The solder paste must be heated to at least its melting point to form these connections.

In embodiments where conductive materials 20' and 20" are solder, it may be desirable for solder 20' and 20" to have different melting points. For example, in certain embodiments SMT component 38 may be mounted to standoff 44 before the standoff and SMT component 42 are mounted to substrate 12. In these embodiments, reflow of solder 20" may be completed to attach SMT component 38 to standoff 44. Then, standoff 44 and SMT component 42 must be mounted to substrate 12 using solder 20'. If solder 20' has the same reflow temperature as solder 20", solder 20" may melt during reflow of solder 20'. This may result in the connection between SMT component 38 and standoff 44 becoming weakened or broken. SMT component 38 may no longer be properly positioned on standoff 44 in this scenario. To avoid this, solder 20" may have a higher melting point than solder 20'. That way, during reflow of solder 20', solder 20" remains solid and the connection between standoff 44 and SMT component 38 remains secure. For example, solder 20" may have a melting point of 250° C. while solder 20' may have a melting point of 243° C. This example is purely illustrative, and solder 20" and solder 20' may have any desired melting points.

Alternatively, in certain embodiments standoffs 44 may be mounted to substrate 12 before SMT component 38 is mounted to the standoffs. In these embodiments, it may be desirable for solder 20" to have a lower melting point than solder 20'. Standoffs 44-1 and 44-2 may be mounted to substrate 12 using the higher temperature solder 20'. SMT component 38 may subsequently be mounted to standoff 44 without disturbing the connections formed by solder 20'. For example, solder 20' may have a melting point of 250° C. while solder 20" may have a melting point of 243° C. This example is purely illustrative, and solder 20" and solder 20' may have any desired melting points.

In FIGS. 4 and 5, SMT component 42 is formed separately from standoffs 44. SMT component 42 may be interposed between standoff portions 44-1 and 44-2. However, SMT component 42 is not integral with standoff 44 and is separated from standoff portions 44-1 and 44-2 by gaps. In an alternative embodiment, an electrical component and standoff portions may be formed in one discrete component.

Figure 6:
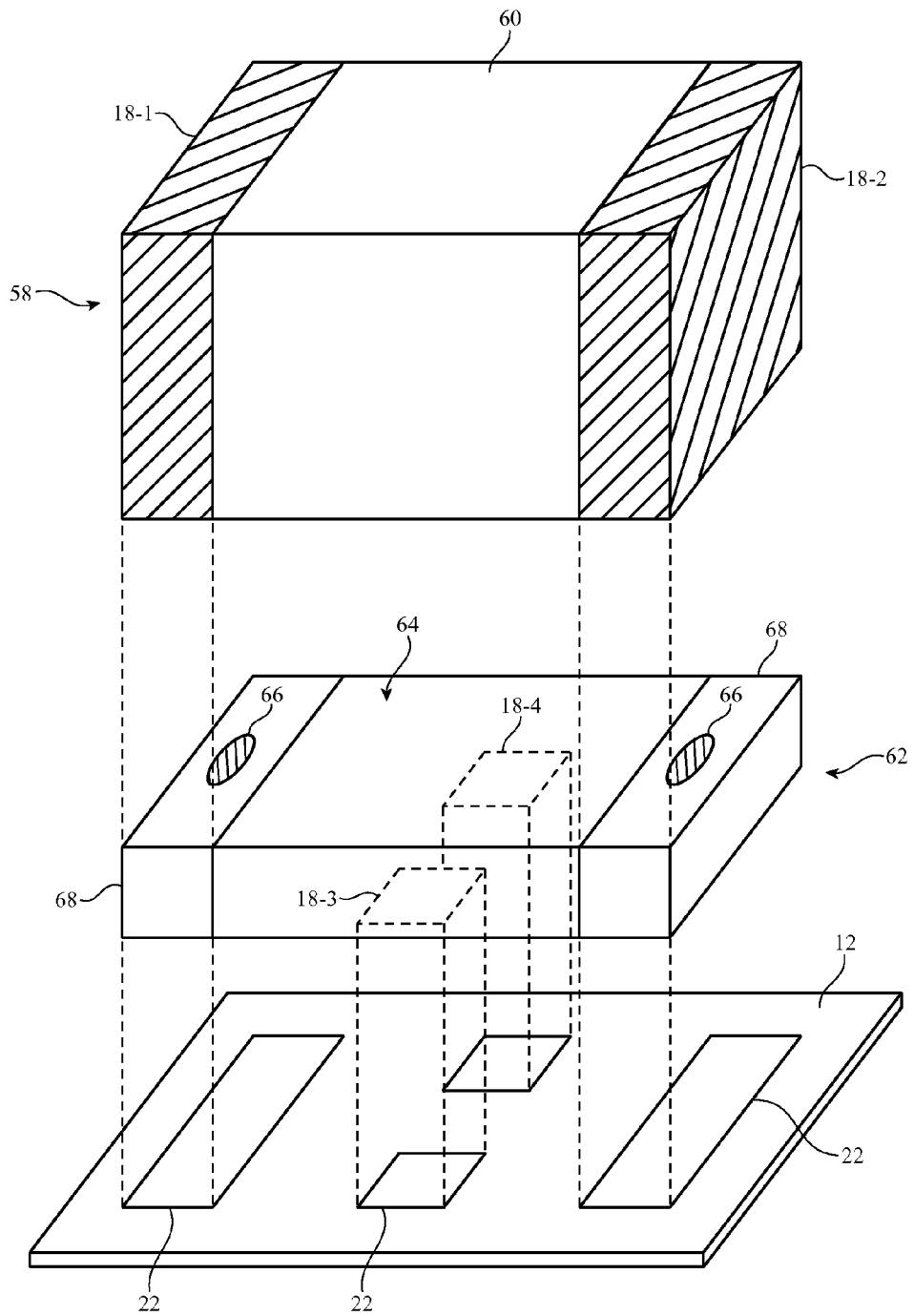
FIG. 6 is an exploded perspective view of an illustrative surface mount technology component with integral standoff portions in accordance with an embodiment.

FIG. 6 is an exploded perspective view of an illustrative SMT component that includes standoff portions. SMT component 58 may have a package housing such as dielectric body 60, sometimes referred to as housing 60. A portion of housing 60 such as the center of housing 60 may be free of conductive contact material. Terminals may be formed from contacts 18-1 and 18-2 on housing 60. Contacts 18-1 and 18-2 may be formed from metal or other conductive material. In the example of FIG. 4, contacts 18-1 and 18-2 have been formed on opposing ends of housing 60. Other configurations for the contacts in SMT device 58 may be used if desired. An electrical component such as a resistor, capacitor, or inductor (or a circuit formed from multiple circuit components) may be housed within housing 60. Electrical components may be housed within the housing or on a surface of the housing. For example, a capacitor may be positioned within housing 60 or a printed resistor may be positioned on a surface of housing 60.

SMT component 58 may be mounted on SMT component 62. SMT component 62 may have a package housing such as housing 64. An electrical component such as a resistor, capacitor, or inductor (or a circuit formed from multiple circuit components) may be housed within housing 64. Electrical components may be housed within the housing or on a surface of the housing. For example, a capacitor may be positioned within housing 64 or a printed resistor may be positioned on a surface of housing 64. Contacts 18-3 and 18-4 may be used to electrically connect the electrical component in housing 64 to substrate 12.

SMT component 62 may also include integral standoff portions 68. Standoff portions 68 may be used to electrically connect terminals 18-1 and 18-2 of SMT component 58 to contact pads 22 on substrate 12. Standoff portions 68 may be formed integrally with SMT component 62. Standoff portions 68 may include conductive vias 66 that extend from the bottom to the top of the standoff. The conductive vias may be surrounded by a dielectric material. In an alternate embodiment, standoff portions 68 may be formed entirely from metal or other conductive materials.

SMT component 58 may entirely overlap SMT component 62 (e.g., no portion of the footprint of SMT component 62 extends past the footprint of SMT component 58). Alternatively, SMT component 58 may only partially overlap SMT component 62 (e.g., a portion of the footprint of SMT component 62 extends past the footprint of SMT component 58).

Figure 7:
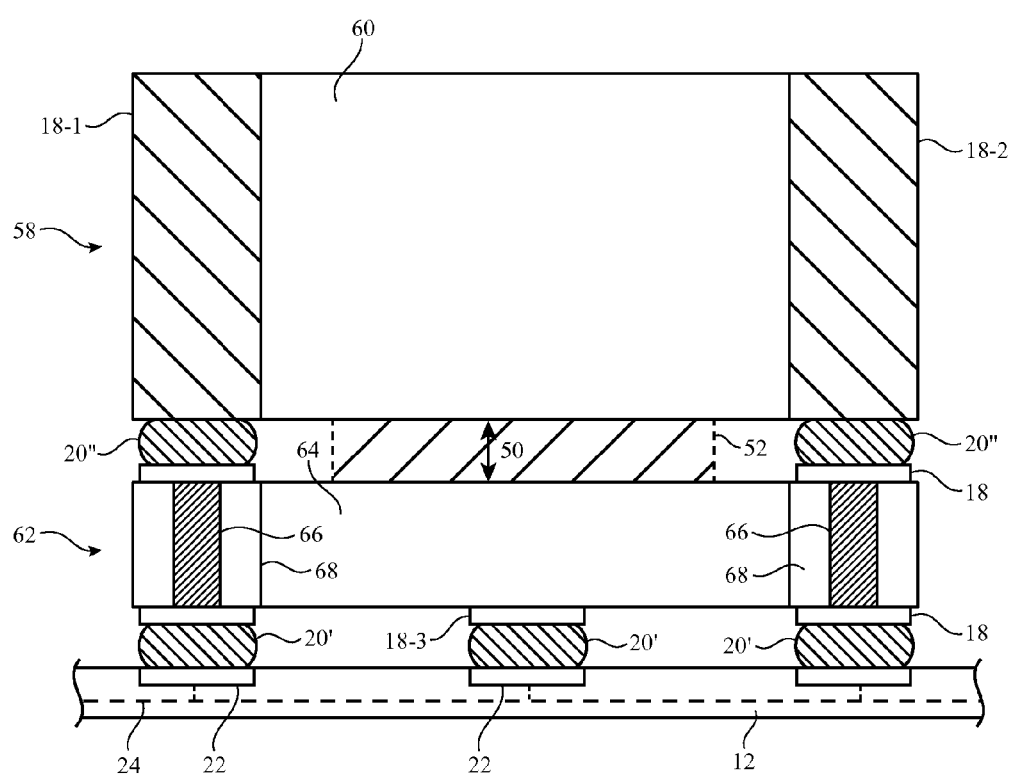
FIG. 7 is a cross-sectional side view of the illustrative surface mount technology component with integral standoff portions shown in FIG. 6 in accordance with an embodiment.

FIG. 7 is a cross-sectional side view of the illustrative SMT component with standoff portions shown in FIG. 6. As shown, SMT component 62 may have contacts 18 that are attached to contact pads 22 in substrate 12 via conductive material 20'. SMT component 62 may include contacts 18 and conductive vias 66 that electrically connect SMT component 58 to substrate 12. Contacts 18-3 and 18-4 in SMT component 62 may be used to provide electrical signals to an electrical component (e.g., a resistor, a capacitor, an inductor, etc.) in housing 64.

FIG. 7 shows contacts 18 disposed on each side of the conductive vias for electrically connecting standoff portions 68 to conductive material 20. This example is purely illustrative. If desired, conductive material 20 may be formed directly on standoff portions 68 and conductive vias 66.

The bottom surface of SMT component 58 and the top surface of SMT component 62 may be separated by gap 50. An optional insulating material 52 may be included in gap 50 to ensure that the bottom surface of SMT component 58 is electrically isolated form the top surface of SMT component 62. In other embodiments, the bottom surface of SMT component 58 may be in direct contact with the top surface of SMT component 62.

In certain embodiments, additional conductive vias may be electrically connected to contacts 18-3 and 18-4 of SMT component 62. For example, a conductive via may couple contact pads 22 to a resistive component on the top surface of SMT component 62.

Conductive material 20" may be used to attach SMT component 58 to SMT component 62. As mentioned in connection with FIG. 5, it may be desirable for conductive material 20" and conductive material 20' to have different melting points. This enables SMT components 58 and 62 to be precisely mounted to substrate 12.

Figure 8:
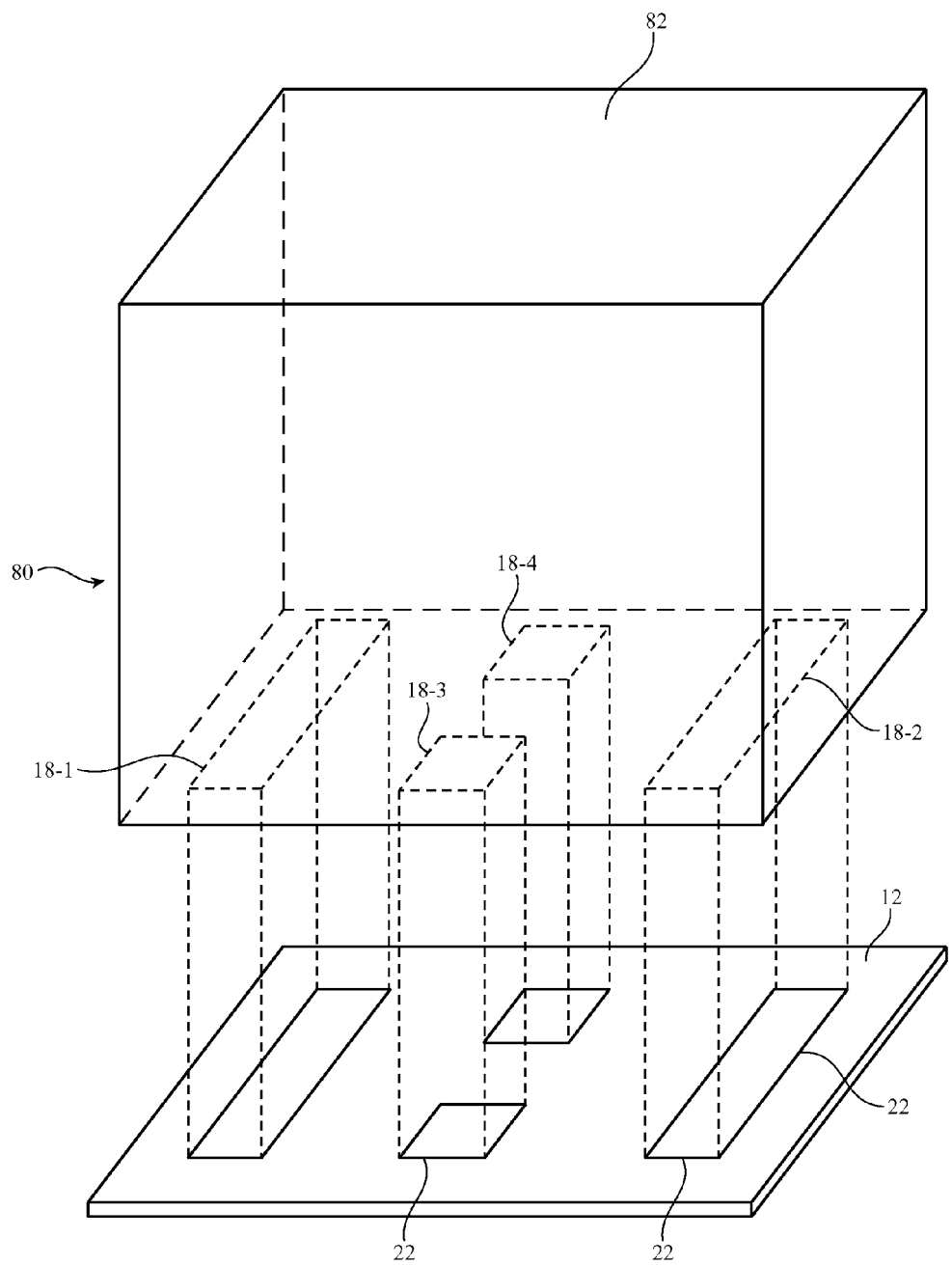
FIG. 8 is an exploded perspective view of an illustrative surface mount technology component that may include more than one electrical component in accordance with an embodiment.

As shown in FIG. 8, in certain embodiments a single SMT component may be provided with multiple electrical components in a single housing. SMT component 80 may have a dielectric body 82. At least one electrical component may be disposed in dielectric body 82, sometimes referred to as housing 82.

Contacts 18 may electrically connect the electrical components to contact pads 22 on substrate 12. Pairs of contacts 18 may each be associated with an electrical component in housing 82. For example, contacts 18-1 and 18-2 may be associated with a capacitor in housing 82, while contacts 18-3 and 18-4 may be associated with a resistor in housing 82. In this illustrative example, signals may be routed to the capacitor via contact 18-1. The signal may be routed back to substrate 12 via contact 18-2. Similarly, signals may be routed to the resistor via contact 18-3 then back to substrate 12 via 18-4.

The aforementioned example is purely illustrative and not meant to limit the invention in any way. Each contact 18 on SMT component 80 may be used to route signals to or from any electrical component. FIG. 8 shows four contacts 18, but there may be any number of contacts 18 and respective contact pads 22 associated with SMT component 80 (e.g., less than 4, more than 4, more than 6, more than 8, more than 12, etc.).

The SMT components in the previous embodiments (e.g., SMT components 38, 42, 58, 62, and 80) may be formed using any desired methods. For example, the SMT components may be low temperature co-fired ceramic (LTCC) devices. Co-fired ceramic devices are formed by independently processing a number of layers (e.g., dielectric layers, conductive layers, resistive layers) and assembling them simultaneously into a ceramic electronic device. Co-firing may be advantageous in embodiments where several electrical components are formed in one housing (e.g., SMT component 80).

In certain applications, it may be desirable to have a single SMT component with multiple circuit configurations. This allows for greater versatility of the SMT component when mounted in an electronic device. FIGS. 9A-9D show illustrative faces of a single SMT component 80, where each face of the SMT component implements a different circuit when mounted to substrate 12. FIGS. 11A-11D show the circuits formed by each face of SMT component 80 when mounted to substrate 12.

Figure 9A:
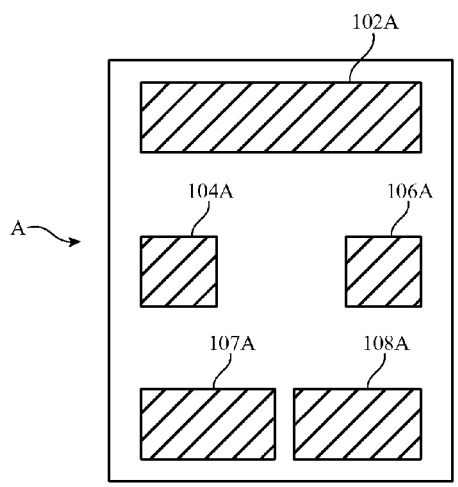
FIGS. 9A-9D are top views of various faces of an illustrative surface mount technology component that includes more than one electrical component in accordance with an embodiment.
Figure 9B:
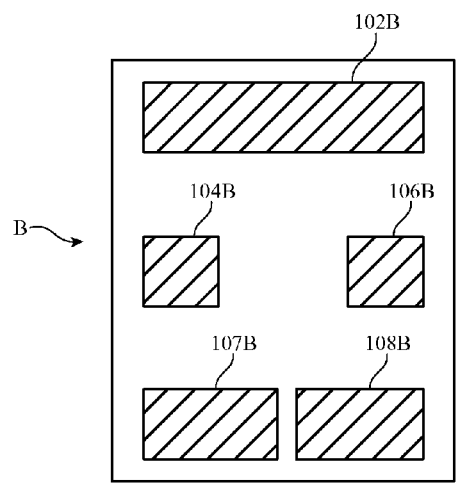
Figure 9C:
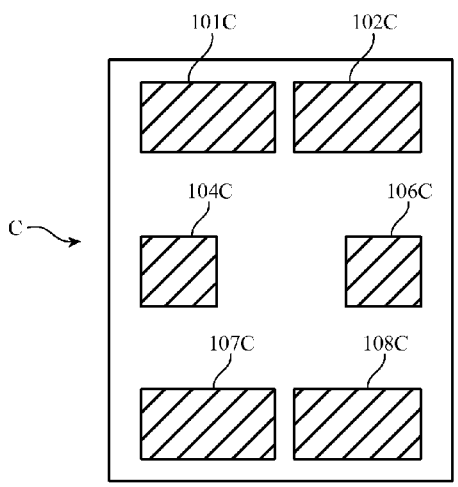
Figure 9D:
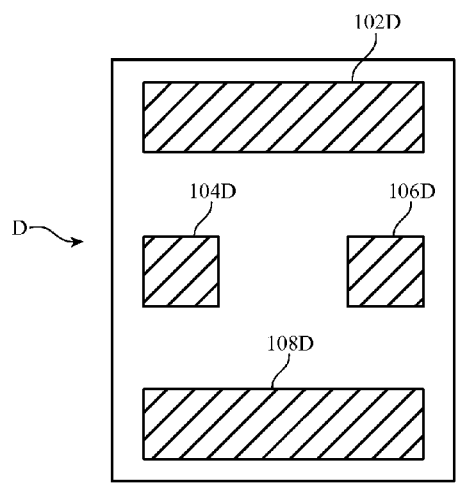

Each face of SMT component 80 may have a number of metal contacts (e.g., contacts 18). As shown in FIG. 9A, face A of SMT component 80 may have contacts 102A, 104A, 106A, 107A, and 108A. As shown in FIG. 9B, face B of SMT component 80 may have contacts 102B, 104B, 106B, 107B, and 108B. As shown in FIG. 9C, face C of SMT component 80 may have contacts 101C, 102C, 104C, 106C, 107C, and 108C. As shown in FIG. 9D, face D of SMT component 80 may have contacts 102D, 104D, 106D, and 108D. Signals may be routed from contacts on SMT component 80 to internal electronic components (e.g., resistors, capacitors, or inductors). These examples are purely illustrative, and each face of SMT component 80 may have any number of contacts in any desired configuration.

In certain embodiments, the same electrical components may be used in the circuit for each face of the SMT component 80. For example, SMT component 80 may include two resistors and each face of the SMT component may be electrically connected to the two resistors in different ways. Alternatively, certain electrical components may only be electrically connected to certain faces of the SMT component. For example, SMT component 80 may include three resistors. Only the first and second resistors may be electrically connected to faces A and B of SMT component 80, while only the second and third resistors may be electrically connected to faces C and D of SMT component 80. In general, any number of electrical components may be disposed in SMT component 80, and each electrical component may be used in the circuit of any number of the faces of the SMT component.

Figure 10:
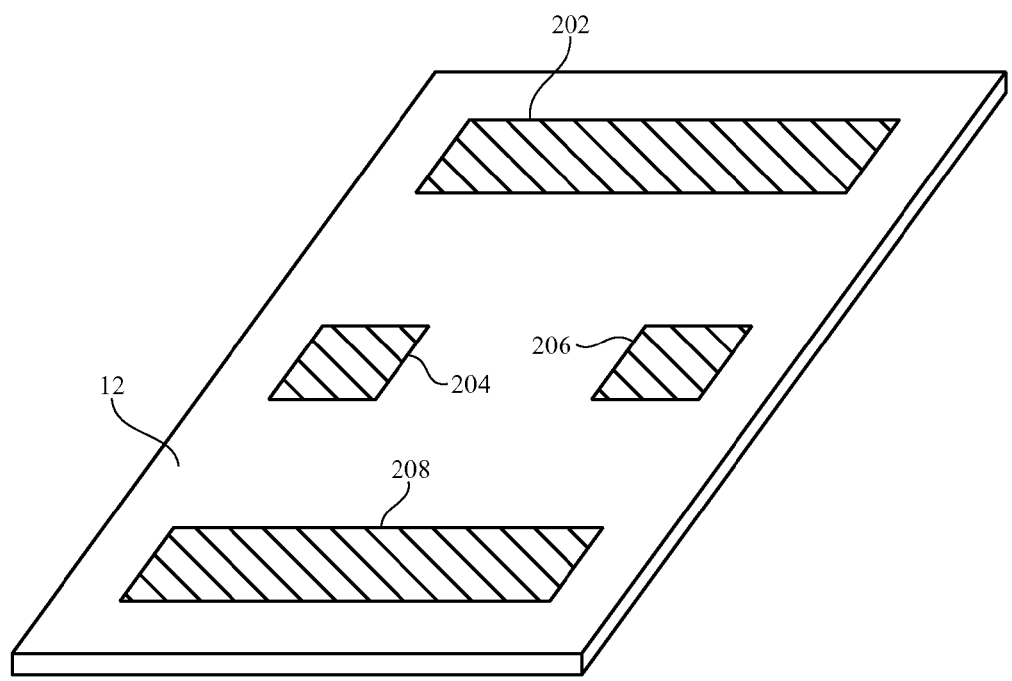
FIG. 10 is a perspective view of an illustrative substrate with contact pads that may be electrically connected to any of the faces shown in FIGS. 9A-9D in accordance with an embodiment.

Substrate 12 may have an arrangement of contact pads (e.g., contact pads 22) on a surface of the substrate. FIG. 10 shows an illustrative arrangement of contact pads on substrate 12. As shown, substrate 12 may have contact pads 202, 204, 206 and 208. SMT component 80 may be mounted on contact pads 202, 204, 206, and 208 of substrate 12. The contacts on SMT component 80 and the contact pads on substrate 12 may be arranged such that any face of SMT component 80 may be mounted on substrate 12. For example, either face A, face B, face C, or face D may be mounted on contact pads 202, 204, 206 and 208. Depending on whether face A, face B, face C, or face D is mounted on substrate 12, SMT component 80 will operate using circuit 100A, circuit 100B, circuit 100C, or circuit 100D respectively. For example, if face D was mounted to substrate 12, contact 102D would be electrically connected to contact pad 202 by conductive material 20, contact 104D would be electrically connected to contact pad 204 by conductive material 20, contact 106D would be electrically connected to contact pad 206 by conductive material 20, and contact 108D would be electrically connected to contact pad 208 by conductive material 20.

FIG. 11A shows an illustrative circuit that may be formed when face A of SMT component 80 is mounted on substrate 12. Circuit 100A may include resistors R1 and R2. R1 may be coupled between contacts 104A and 107A of face A, while R2 may be coupled between contacts 102A and 108A of face A. Contacts 107A and 108A may both be coupled to contact pad 208.

FIG. 11B shows an illustrative circuit that may be formed when face B of SMT component 80 is mounted on substrate 12. Circuit 100B may include resistors R1 and R2 connected in series. R1 may be coupled between contacts 102B and 108B of face B, while R2 may be coupled between contacts 107B and 104B of face B. Contacts 107B and 108B may both be coupled to contact pad 208 on substrate 12. Contact 104B may be coupled to contact pad 204.

FIG. 11C shows an illustrative circuit that may be formed when face C of SMT component 80 is mounted on substrate 12. Circuit 100C may include resistors R1 and R2 connected in parallel. R1 may be coupled between contacts 101C and 107C of face C, while R2 may be coupled between contacts 102C and 108C of face C. Contacts 107C and 108C may both be coupled to contact pad 208 on substrate 12.

FIG. 11D shows an illustrative circuit that may be formed when face D of SMT component 80 is mounted on substrate 12. Circuit 100D may include independently operating resistors. R1 may be coupled between contacts 102D and 108D of face D and R2 may be coupled between contacts 104D and 106D of face D. Contacts 108D and 106D may be coupled to contact pads 208 and 206 respectively.

The aforementioned examples of the arrangements of circuits 100A, 100B, 100C, and 100D are purely illustrative. Circuits 100A, 100B, 100C, and 100D may, for example, use only one electrical component, use more than two electrical components or use different subsets of electrical components. The circuits are also not limited to using only resistors, and the example of two resistors in FIGS. 11A-11D is purely illustrative. SMT component 80 may include one or more resistors, one or more capacitors, and one or more inductors. Circuits 100A, 100B, 100C, and 100D, may each utilize any subset of the electrical components in SMT component 80.

Figure 12:
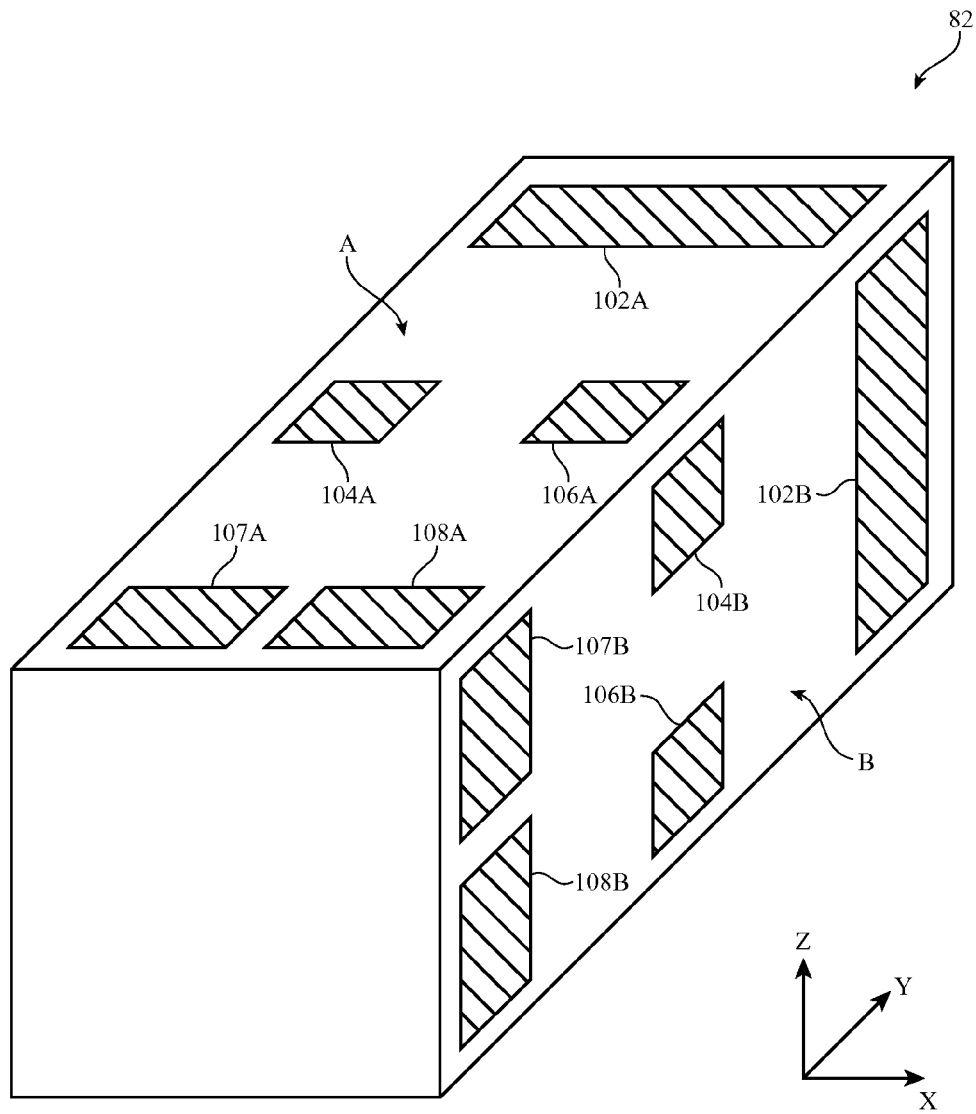
FIG. 12 is a perspective view of the illustrative faces shown in FIGS. 9A and 9B in accordance with an embodiment.
Figure 13:
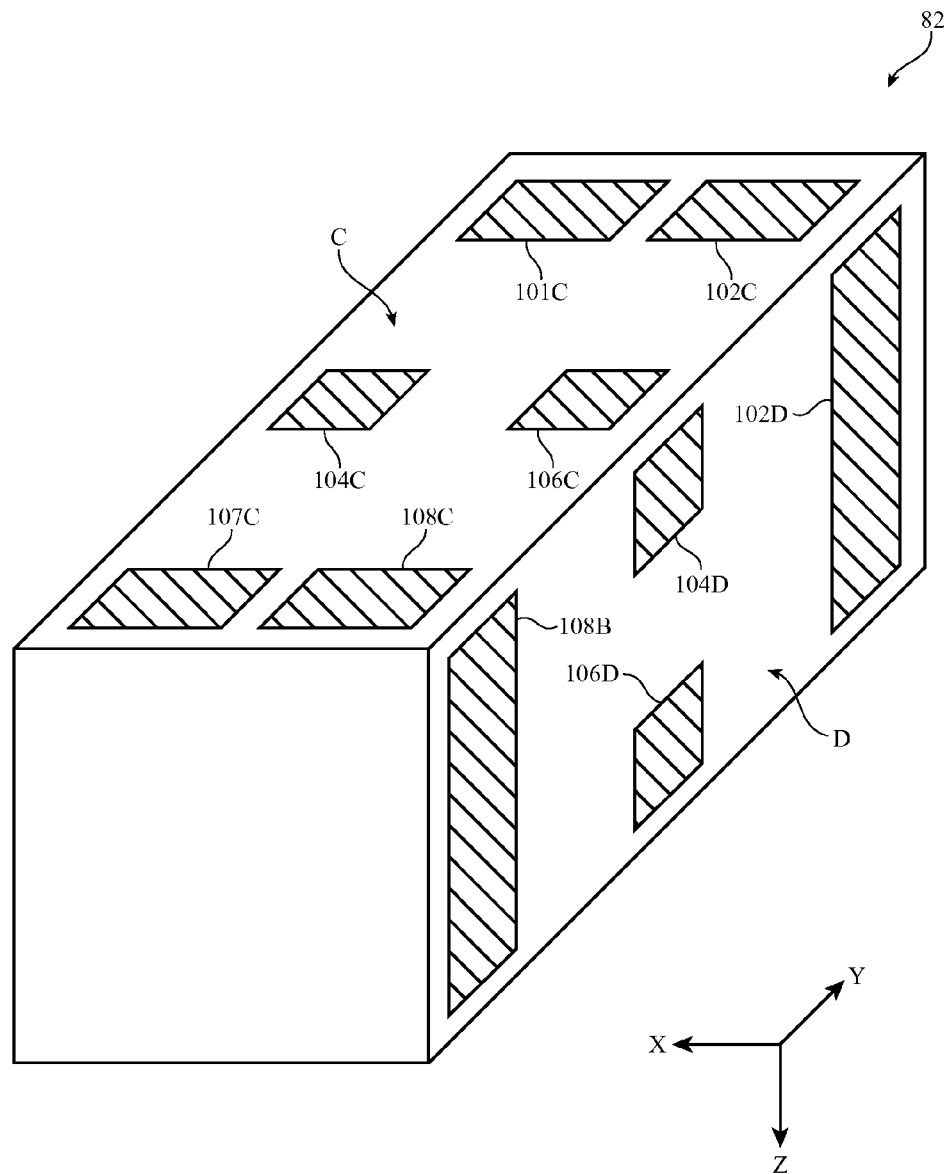
FIG. 13 is a perspective view of the illustrative faces shown in FIGS. 9C and 9D in accordance with an embodiment.

FIGS. 12 and 13 show perspective views of the SMT component with various circuit configurations shown in FIGS. 9A-9D and FIGS. 11A-11D. FIG. 12 shows faces A and B of SMT component 80, while FIG. 13 shows faces C and D of SMT component 80. In FIGS. 12 and 13, SMT component 80 is illustrated as a rectangular prism with contacts on four faces for four possible circuit configurations. This example is purely illustrative, as SMT component 80 may have any desired regular or irregular shape. SMT component 80 may have contacts and respective circuit configurations on any number of faces. For example, SMT component 80 may have two, three, or six faces with metal contacts. Each face with metal contacts may have a unique circuit configuration when mounted on substrate 12.

The foregoing is merely illustrative of the principles of this invention and various modifications can be made by those skilled in the art without departing from the scope and spirit of the invention.

What is claimed is:
1. An apparatus comprising:
   a first surface mount technology component having:
      a dielectric body with a lower surface and an opposing upper surface;
      an electrical component mounted within the dielectric body;

first and second electrical pads on the lower surface of the first surface mount technology component that are coupled respectively to first and second terminals for the electrical component, wherein the first and second pads are coupled respectively to first and second printed circuit board contacts; and first and second standoff portions at opposing ends of the dielectric body that are electrically isolated from the first and second electrical pads and that each have a lower pad on the lower surface of the dielectric body that is shorted to an opposing upper pad on the upper surface of the dielectric body; and a second surface mount technology component having first and second terminals coupled respectively to the upper pads of the first and second standoff portions, wherein the lower pads of the first and second standoff portions are coupled respectively to third and fourth printed circuit board contacts and wherein the second surface mount technology component is separated from the first surface mount technology component by a gap.

2. The apparatus defined in claim 1, wherein the electrical component is interposed between the first and second standoff portions.

3. The apparatus defined in claim 2, wherein the upper pad on the first standoff portion is soldered to the first terminal of the second surface mount technology component, and wherein the upper pad on the second standoff portion is soldered to the second terminal of the second surface mount technology component.

4. The apparatus defined in claim 2, wherein the first and second standoff portions each comprise a dielectric material with a conductive via that extends from the lower surface to the upper surface.

5. The apparatus defined in claim 4, wherein the conductive vias of the first and second standoff portions are each coupled respectively to the lower pad at the lower surface and the upper pad at the upper surface.

6. The apparatus defined in claim 2, wherein the electrical component comprises an electrical component selected from the group consisting of: a capacitor, a resistor, and an inductor.

7. The apparatus defined in claim 6, wherein the second surface mount technology component comprises an electrical component selected from the group consisting of: a capacitor, a resistor, and an inductor.

8. The apparatus defined in claim 1, wherein the upper pad on each of the first and second standoff portions is soldered respectively to the first and second terminals of the second surface mount technology component with solder having a first melting point, and wherein the lower pads of the first and second standoff portions are soldered respectively to the third and fourth printed circuit board contacts with solder having a second melting point.

9. The apparatus defined in claim 8, wherein the first melting point is higher than the second melting point.

10. The apparatus defined in claim 1, wherein the second surface mount technology component comprises a surface mount technology component selected from the group consisting of: a 0201 surface mount technology component and a 1005 surface mount technology component.

11. The apparatus defined in claim 1, wherein the first and second standoff portions are formed integrally with the dielectric body.

12. The apparatus defined in claim 11, wherein the first and second standoff portions each comprises a dielectric material with a conductive via that extends from the lower surface to the upper surface.

13. The apparatus defined in claim 11, wherein the first and second standoff portions each comprises a block of metal.

14. An apparatus, comprising:
a first surface mount technology component with at least one component contact coupled to at least one printed circuit board contact, wherein the first surface mount technology component has a top surface;

first and second metal members coupled to first and second additional printed circuit board contacts, wherein the first surface mount technology component is interposed between the first and second metal members;

a second surface mount technology component that is coupled to the first and second metal members and that overlaps the first surface mount technology component, wherein the second surface mount technology component has a bottom surface and wherein the top surface of the first surface mount technology component and the bottom surface of the second surface mount technology component are separated by a gap; and an insulating layer in the gap between the top surface of the first surface mount technology component and the bottom surface of the second surface mount technology component.

15. The apparatus defined in claim 14, wherein the first and second metal members each comprise a block of metal that is soldered respectively between the first and second printed circuit board contacts and first and second component contacts on the second surface mount technology component.

16. The apparatus defined in claim 15, wherein the first surface mount technology component is interposed between the first and second metal members.

17. The apparatus defined in claim 16, wherein the first and second metal members have respective first and second heights, wherein the first surface mount technology component has a height, and wherein the first and second heights of the first and second metal members are greater than the height of the first surface mount technology component.

18. A surface mount technology component comprising:
a dielectric body with first and second opposing surfaces;
an electrical component mounted within the dielectric body;
first and second electrical component pads on the first surface that are coupled respectively to first and second printed circuit board contacts; and
first and second standoff portions that are electrically isolated from the first and second electrical component pads and that each have a lower pad on the first surface of the dielectric body that is shorted to an opposing upper pad on the second surface of the dielectric body, wherein the first and second standoff portions are integrally formed with the dielectric body.

19. The surface mount technology component defined in claim 18, wherein the upper pads of the first and second standoff portions are coupled respectively to first and second pads of a second surface mount technology component.

20. The surface mount technology component defined in claim 19, wherein the lower pads of the first and second standoff portions are coupled respectively to third and fourth printed circuit board contacts.

21. The surface mount technology component defined in claim 18, wherein the electrical component is interposed between the first and second standoff portions.

22. The surface mount technology component defined in claim 18, wherein the first and second standoff portions comprise conductive vias extending between the upper pad and the lower pad.

* * * * *